United States Patent [19]

Dhong et al.

[11] Patent Number: 4,954,854
[45] Date of Patent: Sep. 4, 1990

[54] CROSS-POINT LIGHTLY-DOPED DRAIN-SOURCE TRENCH TRANSISTOR AND FABRICATION PROCESS THEREFOR

[75] Inventors: Sang H. Dhong, Mahopac; Wei Hwang, Armonk; Nicky Chau-Chun Lu, Yorktown Heights, all of N.Y.

[73] Assignee: International Business Machines Corporation, Armonk, N.Y.

[21] Appl. No.: 355,232

[22] Filed: May 22, 1989

[51] Int. Cl.⁵ .................. H01L 29/78; H01L 29/06; H01L 27/10
[52] U.S. Cl. .................. 357/23.4; 357/23.9; 357/55; 357/90; 357/45; 357/23.6
[58] Field of Search .................. 357/23.4, 23.3, 23.6, 357/23.9, 55

[56] References Cited

U.S. PATENT DOCUMENTS

| | | | |
|---|---|---|---|
| 4,466,178 | 8/1984 | Soclof | 29/576 B |
| 4,541,001 | 9/1985 | Schutten et al. | 357/23.4 |
| 4,649,625 | 3/1987 | Lu | 29/571 |
| 4,651,184 | 3/1987 | Malhi | 357/23.6 |
| 4,670,768 | 6/1987 | Sunami et al. | 357/42 |
| 4,672,410 | 6/1987 | Miura et al. | 357/23.6 |
| 4,673,962 | 6/1987 | Chatterjee et al. | 357/23.6 |
| 4,683,486 | 7/1987 | Chatterjee | 357/23.6 |
| 4,683,643 | 8/1987 | Nakajima et al. | 437/203 |
| 4,728,623 | 3/1988 | Lu et al. | 437/52 |
| 4,833,516 | 5/1989 | Hwang et al. | 357/55 |

FOREIGN PATENT DOCUMENTS

| | | | |
|---|---|---|---|
| 4079 | 1/1979 | Japan | 357/23.4 |
| 58-3287A | 10/1983 | Japan | |
| 142774 | 6/1986 | Japan | 357/23.4 |
| 244683 | 10/1988 | Japan | 357/23.3 |

OTHER PUBLICATIONS

IBM Technical Disclosure Bulletin vol. 23, No. 9 Feb. 1981 p. 4052 "Reduced Bit Line Capacitance in VMOS Devices" by D. M. Kenney.
IBM Technical Disclosure Bulletin vol. 29, No. 5, Oct. 1986 "High Density Vertical Dram Cell" p. 2335.

*Primary Examiner*—Rolf Hille
*Assistant Examiner*—Robert P. Limanek
*Attorney, Agent, or Firm*—John J. Goodwin

[57] ABSTRACT

A structure and fabrication process for a self-aligned, lightly-doped drain/source n-channel field-effect transistor wherein a trench is formed in a well region in a wafer including an epitaxial layer on a substrate. A first, heavily doped drain region and bit line element is formed around the trench on the surface of the well, and a second, lightly-doped drain region is formed proximate to the first drain region and self-aligned to the trench sidewalls. A source region is located beneath the trench, which is filled with polysilicon, above which is gate and further polysilicon forming a transfer wordline. The well region at the trench sidewalls are doped to control the device threshold level, and the device is thereby also located at a wordline/bitline cross-point.

3 Claims, 8 Drawing Sheets

CROSS-POINT LIGHTLY-DOPED DRAIN-SOURCE TRENCH TRANSISTOR AND FABRICATION PROCESS THEREFOR

BACKGROUND OF THE INVENTION

1. Field of the Invention

The present invention relates to a vertical lightly-doped drain trench transistor for ROM and DRAM cells and to a method of fabricating the same.

2. Description of the Prior art

In U.S. Pat. No. 4,466,178, issued Aug. 21, 1984 to Soclof entitled METHOD OF MAKING EXTREMELY SMALL AREA PNP LATERAL TRANSISTOR BY ANGLED IMPLANT OF DEEP TRENCHES FOLLOWED BY REFILLING THE SAME WITH DIELECTRICS, an array of hundreds of devices may be simultaneously processed on a chip to sub-micron dimensions by establishing tiny active regions for each transistor surrounded by field oxide filled moats or slotted regions, wherein the slots are utilized to dope the substrate within the active region. The P type substrate is double energy arsenic planted through one surface to establish a N region to a given depth. This surface is oxidized and photoresist masked conventionally to open regions for the slots which are ion milled or ODE etched to a given depth. P+ regions are established by the slots by ion implanting at an angle such that the entire depth of the slot is not doped but rather the doping is confined to a region within the double energy N implanted depth. Drive-in diffusion enlarges the P+ areas for the emitter and collector and oxidation fills the moat insulating regions around the active area.

The oxide is stripped and the N region enhanced to N+ at the surface, with silox being deposited and opened for metal contacts to the N+ region for the base and the emitter and collector regions. The doping profile of the base region provides a potential barrier to minimize the flow of electrons toward the surface because the emitter electrons are channeled through the less heavily doped part of the base region to the collector.

In U.S. Pat. No. 4,541,001, issued Sept. 10, 1985 to Schutten et al entitled BIDIRECTIONAL POWER FET WITH SUBSTRATE-REFERENCED SHIELD, a bidirectional power FET structure is disclosed with high OFF state voltage blocking capability. A shielding electrode is insulated between first and second gate electrode in a notch between laterally spaced source regions and channel regions joined by a common drift region around the bottom of the notch. The shielding electrode is ohmically connected to the substrate containing the common drift region to be at the same potential level thereof and within a single junction drop of a respective main electrode across the junction between the respective channel containing region and drift region. The steering diode function for referencing the shielding electrode is performed by junctions already present in the integrated structure, eliminating the need for discrete dedicated steering diodes. The shielding electrode prevents the electric field gradient toward the gate electrode on one side of the notch from inducing depletion in the drift region along the opposite side of the notch. This prevents unwanted inducement of conduction channels in the drift region during the OFF state of the FET.

In U.S. Pat. No. 4,649,625, issued Mar. 17, 1987 to Lu entitled DYNAMIC MEMORY DEVICE HAVING A SINGLE-CRYSTAL TRANSISTOR ON A TRENCH CAPACITOR STRUCTURE AND A FABRICATION METHOD THEREFOR, dynamic random access memory (DRAM) devices are taught wherein individual cells, including an access transistor and a storage capacitor are formed on a single-crystal semiconductor chip, and more particularly a three-dimensional dynamic random access memory (DRAM) device structure is described having a single-crystal access transistor stacked on top of a trench capacitor and a fabrication method therefor wherein crystallization seeds are provided by the single-crystal semiconductor area surrounding the cell and/or from the vertical sidewalls of the trench and wherein the access transistor is isolated by insulator. In the structure, a trench is located in a p+ type substrate containing heavily doped N+ polysilicon. A composite film of $SiO_2/Si_3N_4/SiO_2$ is provided for the capacitor storage insulator. A thin layer of $SiO_2$ is disposed over the polysilicon. A lightly doped p-type epi silicon layer is located over the substrate and $SiO_2$ layer. The access transistor for the memory cell is located on top of the trench capacitor. An N+ doped material connects the source region of the transistor to the polysilicon inside the trench. A medium doped p-region on top of the trench surface may be provided in case there is any significant amount of leakage current along the trench surface.

In U.S. Pat. No. 4,651,184, issued Mar. 17, 1987 to Malhi entitled DRAM CELL AND ARRAY, a DRAM cell and array of cells, together with a method of fabrication, are disclosed wherein the cell includes one field effect transistor and one capacitor with both the transistor and the capacitor formed in a trench in a substrate. One capacitor plate and the transistor source are common and are formed in the lower portion of the trench sidewall. The transistor drain is formed in the upper portion of the trench sidewall to connect to a bit line on the substrate surface, and the channel is the vertical portion of the trench sidewall between the source and drain. A ground line runs past the transistor gate in the upper portion of the trench down into the lower portion of the trench to form the other capacitor plate.

In U.S. Pat. No. 4,670,768, issued June 2, 1987 to Sunami et al entitled COMPLEMENTARY MOS INTEGRATED CIRCUITS HAVING VERTICAL CHANNEL FETS, a semiconductor integrated circuit comprising semiconductor regions in the form of first and second protruding poles that are provided on a semiconductor layer formed on a semiconductor substrate or an insulating substrate, and that are opposed to each other with an insulating region sandwiched therebetween, a p-channel FET provided in the first semiconductor region, and an n-channel FET provided in the second semiconductor region. These FET's have source and drain regions on the upper and bottom portions of the semiconductor regions, and have gate electrodes on the sides of the semiconductor regions. The insulation region between the protruding pole-like semiconductor regions is further utilized as the gate electrode and the gate insulating film.

In U.S. Pat. No. 4,672,410, issued June 9, 1987 to Miura et al entitled SEMICONDUCTOR MEMORY DEVICE WITH TRENCH SURROUNDING EACH MEMORY CELL, discloses a semiconductor device that has memory cells respectively located at intersections of bit and word lines arranged in a matrix form, each of the memory cells being constituted by a single insulated gate transistor and a single capacitor. One memory cell is formed in an element formation region defined by each of trenches arranged in a matrix form. The capacitor has an insulating film formed along part of a sidewall surface of a trench formed in at least a direction of thickness of a semiconductor substrate and a conductive layer formed along the insulating film. The transistor has a gate insulating film adjacent to the capacitor and formed along a remaining portion of the sidewall surface of the trench, a gate electrode formed along the gate insulating film and a diffusion region formed in a major surface of the semiconductor substrate which is adjacent to the gate insulating film. The semiconductor memory device further has an isolation region between two adjacent ones of the memory cells along two adjacent ones of the bit or word lines. A method of manufacturing the semiconductor is also proposed.

In U.S. Pat. No. 4,673,962, issued June 16, 1987 to Chatterjee et al entitled VERTICAL DRAM CELL AND METHOD, DRAM cells and arrays of cells on a semiconductor substrate, together with methods of fabrication, are disclosed wherein the cells are formed in pairs or quartets by excavating a trench or two trenches through the cell elements to split an original cell into two or four cells during the fabrication. The cells include vertical field effect transistors and capacitors along the trench sidewalls with word lines and bit lines crossing over the cells.

In U.S. Pat. No. 4,683,486, issued July 28, 1987 to Chatterjee entitled DRAM CELL AND ARRAY, a DRAM cell and array of cells, together with method of fabrication, are disclosed wherein the cell includes one field effect transistor and one storage capacitor with both the transistor and the capacitor formed in a trench in a substrate. The transistor source, channel, and drain and one capacitor plate are formed in a layer of material inserted into the trench and insulated from the substrate; the gate and other capacitor plate are formed in the substrate trench sidewall. In preferred embodiment bit lines on the substrate surface connect to the inserted layer, and word lines on the substrate surface are formed as diffusions in the substrate which also form the gate. The trenches and cells are formed in the crossings of bit lines and word lines; the bit lines and word lines form perpendicular sets of parallel lines.

In U.S. Pat. No. 4,683,643, issued Aug. 4, 1987 to Nakajima et al entitled METHOD OF MANUFACTURING A VERTICAL MOSFET WITH SINGLE SURFACE ELECTRODES, a vertical metal oxide semiconductor field effect transistor has a trench substantially vertically formed in a major surface of a semiconductor substrate, a first conductive layer formed in a predetermined region including a sidewall surface of the trench on a gate insulating film, lower and upper diffusion layers formed in the bottom of the trench and a surface layer of the semiconductor substrate, preferably a channel doped region formed in the semiconductor substrate between the upper and lower diffusion layers, and a second conductive layer formed in contact with the lower diffusion layer in the bottom of the trench and insulated from the first conductive layer so as to fill the trench. The first conductive layer serves as a gate electrode, and the diffusion layers serves as source/drain regions, respectively. A method of manufacturing the vertical MOSFET is also proposed.

In U.S. Pat. No. 4,728,623, issued Mar. 1, 1988 to Lu et al entitled A FABRICATION METHOD FOR FORMING A SELF-ALIGNED CONTACT WINDOW AND CONNECTION IN AN EPITAXIAL LAYER AND DEVICE STRUCTURES EMPLOYING THE METHOD, a fabrication process for providing an epitaxial layer on a silicon substrate and over predefined insulator-capped islands which forms a self-aligned contact window in the epitaxial layer.

Application of the method to a three-dimensional dynamic random access memory (DRAM) device structure is shown, with an access transistor formed in monocrystalline silicon stacked on top of a trench capacitor. A fabrication method therefor is shown wherein the contact window for the source-to-trench connection is formed by self-aligned lateral epitaxial growth, followed by a contact-connection formation step using either a second epitaxial growth or a CVD refill and strapping process. The invention can be further applied to other device structures using the described principles, and more specifically to an inverter structure having the driver device stacked over the load-resistor as another example, which can be used as a basic building circuit unit for logic circuits and static-RAM cell.

Attention is also directed to Japanese Patent No. 58-3287 issued Oct. 1, 1983 to Yuuji Furumura entitled VERTICAL CYLINDRICAL MOS FIELD EFFECT TRANSISTOR and IBM Technical Disclosure Bulletin publication appearing in Vol. 23, No. 9, Feb. 1981 at page 4052, "Reduced Bit Line Capacitance in VMOS Devices" by D. M. Kenney and Vol. 29, No. 5, October 1986 at page 2335, "High Density Vertical Dram Cell."

SUMMARY OF THE INVENTION

An object of the present invention is to provide an improved trench transistor including a lightly-doped drain/source (LDD) region.

Another object of the present invention is to provide an improved trench transistor structure to improve the electrical breakdown, short-channel effects and reliability.

Another object of the present invention is to provide an improved fabrication process for providing a method to adjust (or control) the threshold voltage of trench transistor by using oblique angle ion implantation or electron cyclotron resonant (ECR) surface doping technique.

A further object of the present invention is to provide an improved performance for ROM and DRAM cells wherein the trench transistor with lightly-doped drain/source region is disposed in a cross-point at the crossing of a word line and bit line.

DESCRIPTION OF THE PREFERRED EMBODIMENTS

Figure 1:
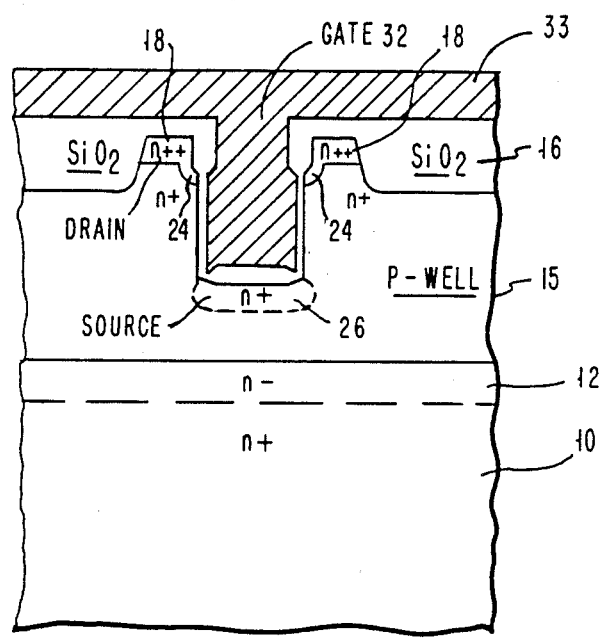
FIG. 1 is a side cross-sectional illustration of an embodiment of a trench transistor according to the present invention.

A new fabrication process is described for a novel cross-point lightly-doped drain/source (LDD) trench transistor. The cross section of this new vertical transistor is shown in FIG. 1 together with a plan view of its schematic layout shown in FIG. 2. The trench transistor is built on the surface of a U-groove. The U-groove shallow trench transistor is designed to be disposed in a cross-point at the crossing of a wordline and a bit line of a memory. The layout of this transistor provides the advantages of ultra small size, high packing density, and faster performance. The applications of the trench transistor of the present invention to ROM and DRAM cells are also described.

The novel fabrication process for the self-aligned, lightly-doped drain/source (LDD) n-channel field-effect trench transistors are described in the following steps.

Figure 3:
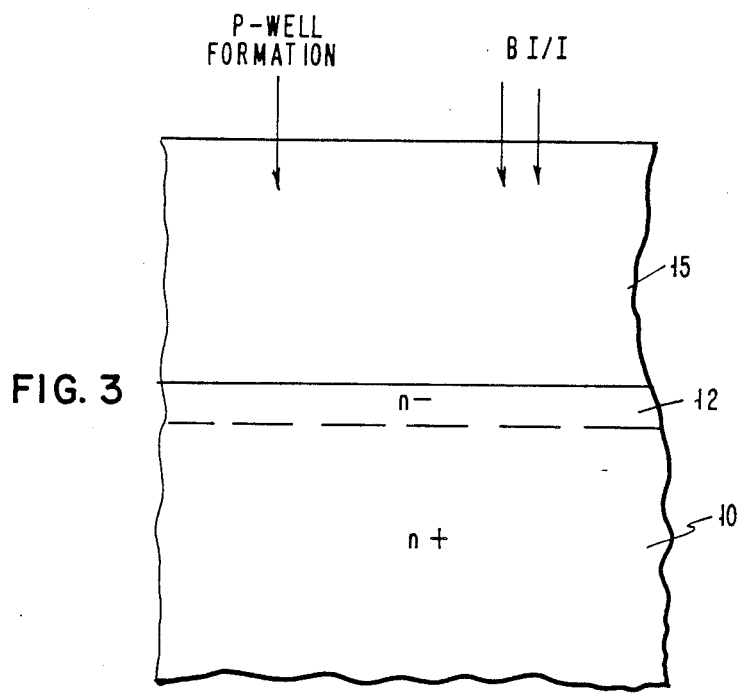
FIGS. 3 through 12 are side cross-sectional illustrations of the trench transistor of FIG. 1 in various stages of the fabrication process of the present invention.
Figure 4:
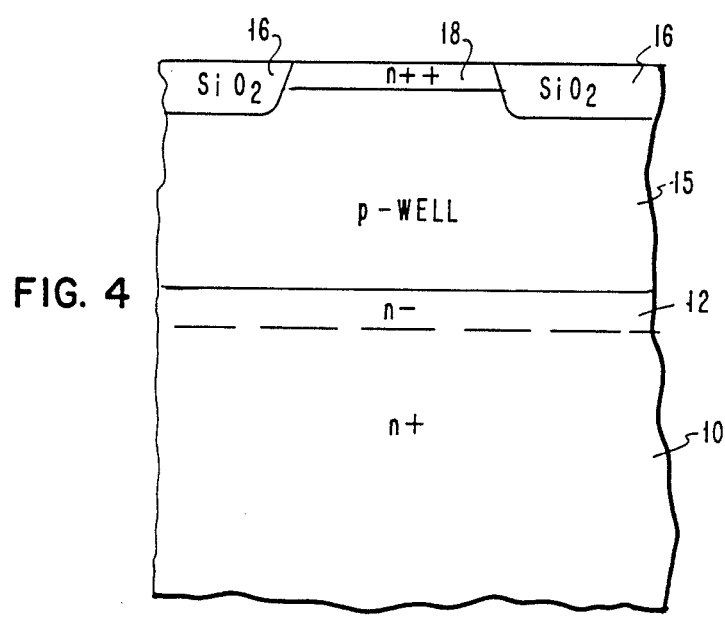

Step (1) Start with a wafer with n- epi layer 12 on n+ substrate 10, pattern and form pad oxide and silicon nitride layers, define and ion-implant boron to form a retrograde p-well region 15 as shown in FIG. 3.

Figure 2:
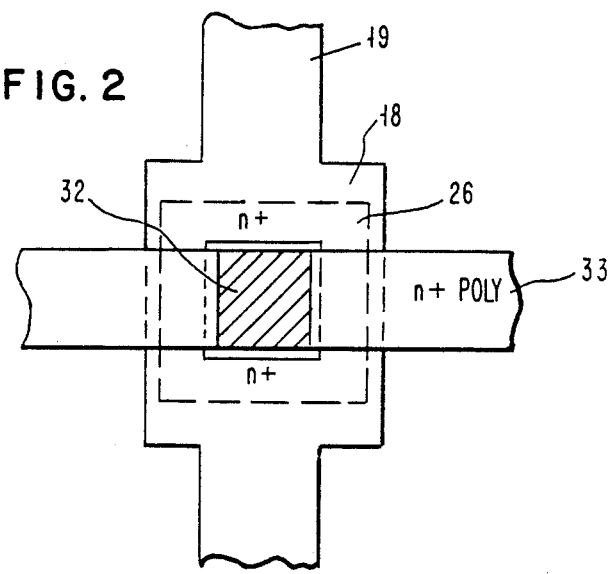
FIG. 2 is a plan view of a schematic illustration of the trench transistor of FIG. 1.

Step (2) Form pad oxide, define the shallow oxide isolation trench regions 16. Then implant phosphorous to form n++ diffusion region 18. This region 18 will be formed as drain junctions of the resultant access transistors and will also extend to serve as diffusion bit lines 19 as shown in FIG. 2.

Figure 5:
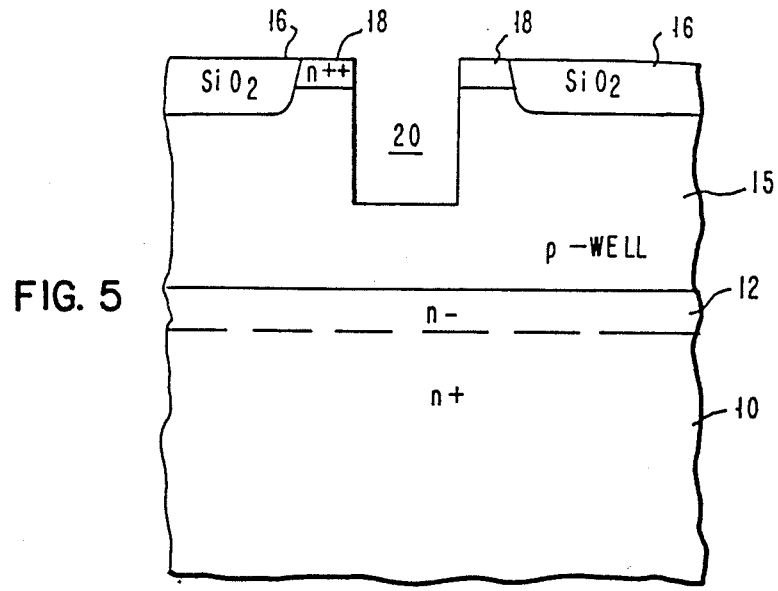

Step (3) Form pad oxide, define and etch shallow trench 20 using RIE to form vertical access transistor region as shown in FIG. 5. The depth of this shallow trench is designed to be located either inside or outside the p-well region 15, depending on the applications.

Figure 6:
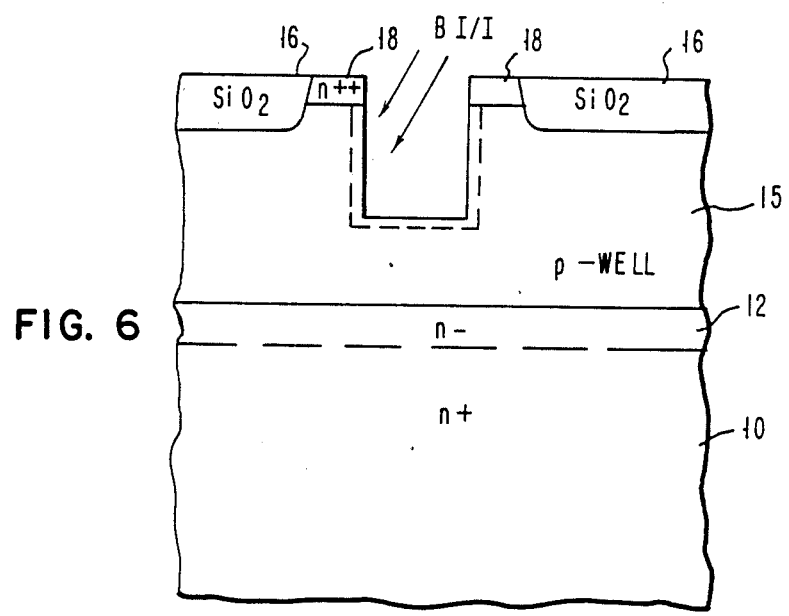

Step (4) Perform p+ doping at the sidewall of the trench to control the n-channel threshold voltage by using the oblique ion implantation technique or electron cycletron resonant (ECR) surface doping technique as shown in FIG. 6. The ion incident angle is adjusted according to aspect ratio of the groove. This step 6 is not mandatory.

Figure 7:
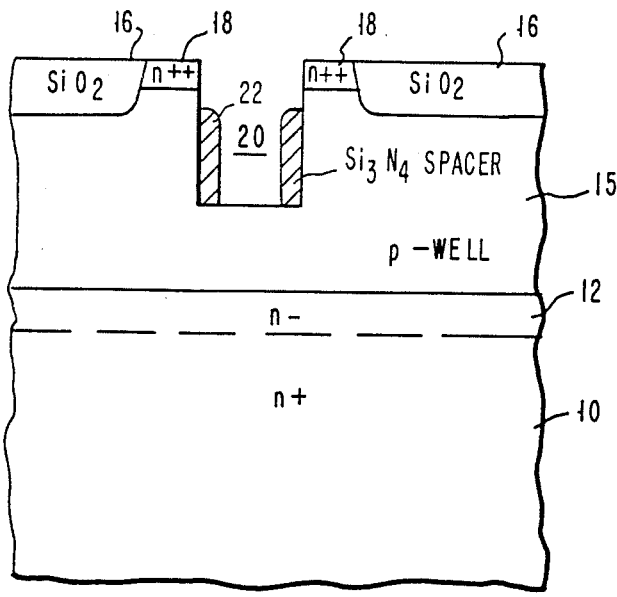

Step (5) Form pad oxide and silicon nitride layers. Then use proper highly selective etching (slightly over-etching) to form silicon nitride sidewall spacer 22 at the sidewalls of shallow trench as shown in FIG. 7.

Figure 8:
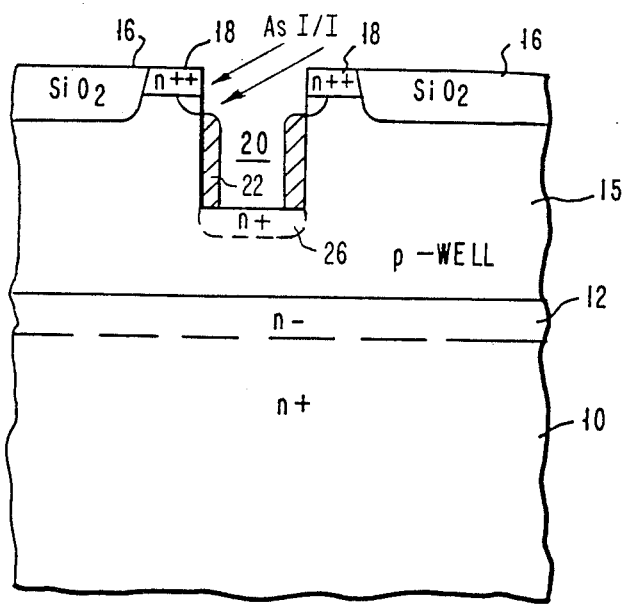

Step (6) Form self-aligned and lightly-doped drain (LDD) like n+ junction 24 and buried n+ source junction 26 simultaneously by the low angle oblique ion implantation technique as shown in FIG. 8.

Figure 9:
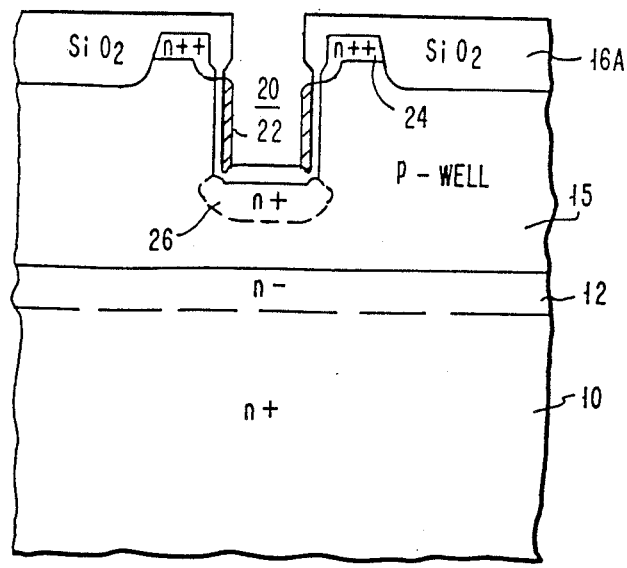

Step (7) As shown in FIG. 9, grow the thicker oxide region 16A wherein the thickness is greater than that of the gate oxide.

Figure 10:
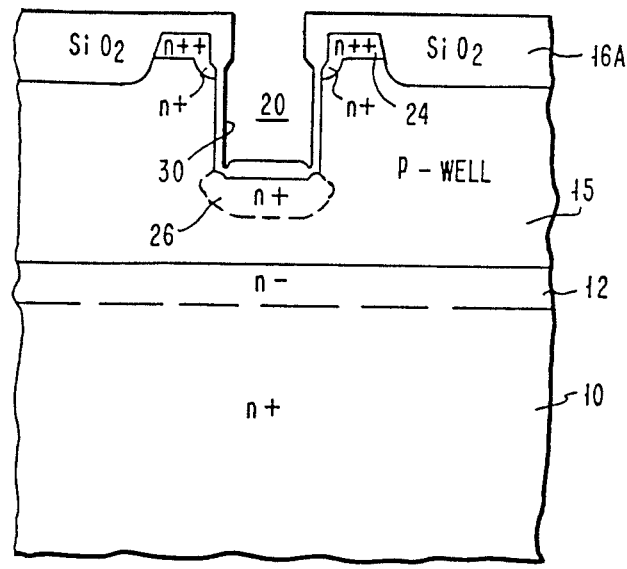

Step (8) Remove the silicon nitride sidewall spacer 22 by selective etching. Then grow a thin gate oxide layer 30 on the vertical walls at the shallow trench and on the other area as shown in FIG. 10.

Figure 11:
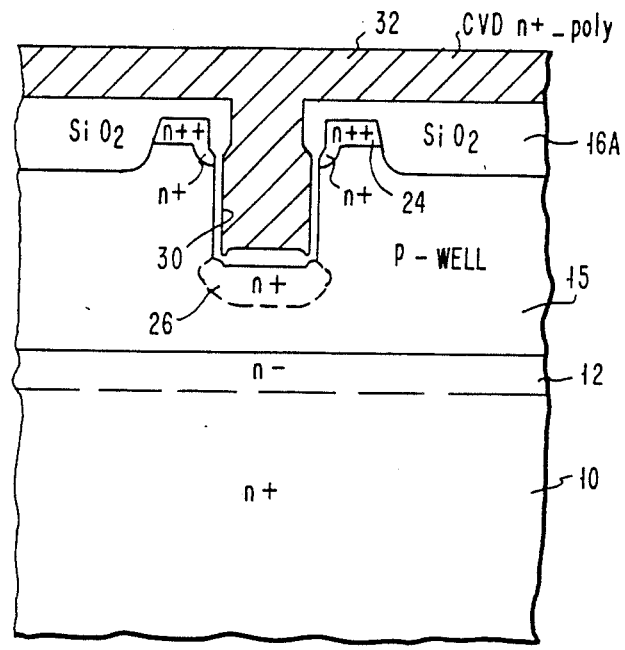

Step (9) Fill shallow trench with CVD n+ polysilicon and pattern to form the transfer gate 32 and word line 33. Deposit metal, react to form silicide. The rest of the fabrication processes are kept the same as standard CMOS technology to complete the transistor structure of FIG. 11. The final cross section of the trench cell is shown in FIG. 1.

Figure 12:
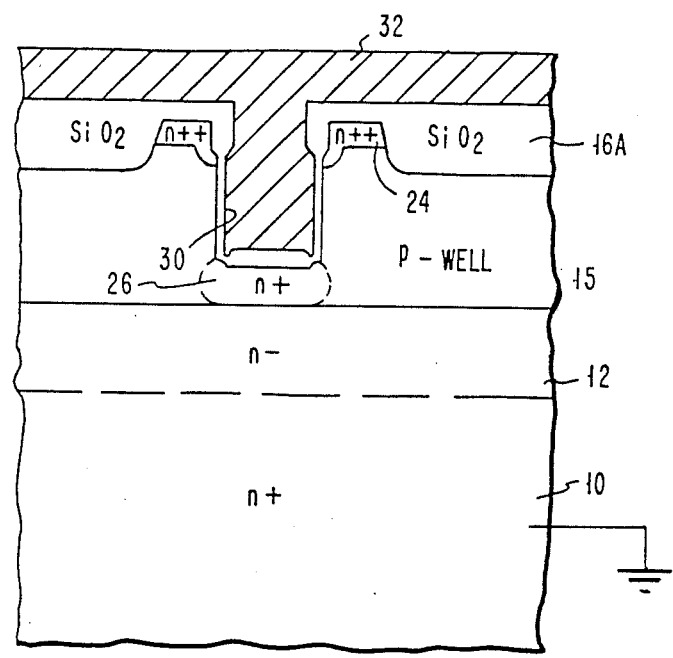
Figure 13:
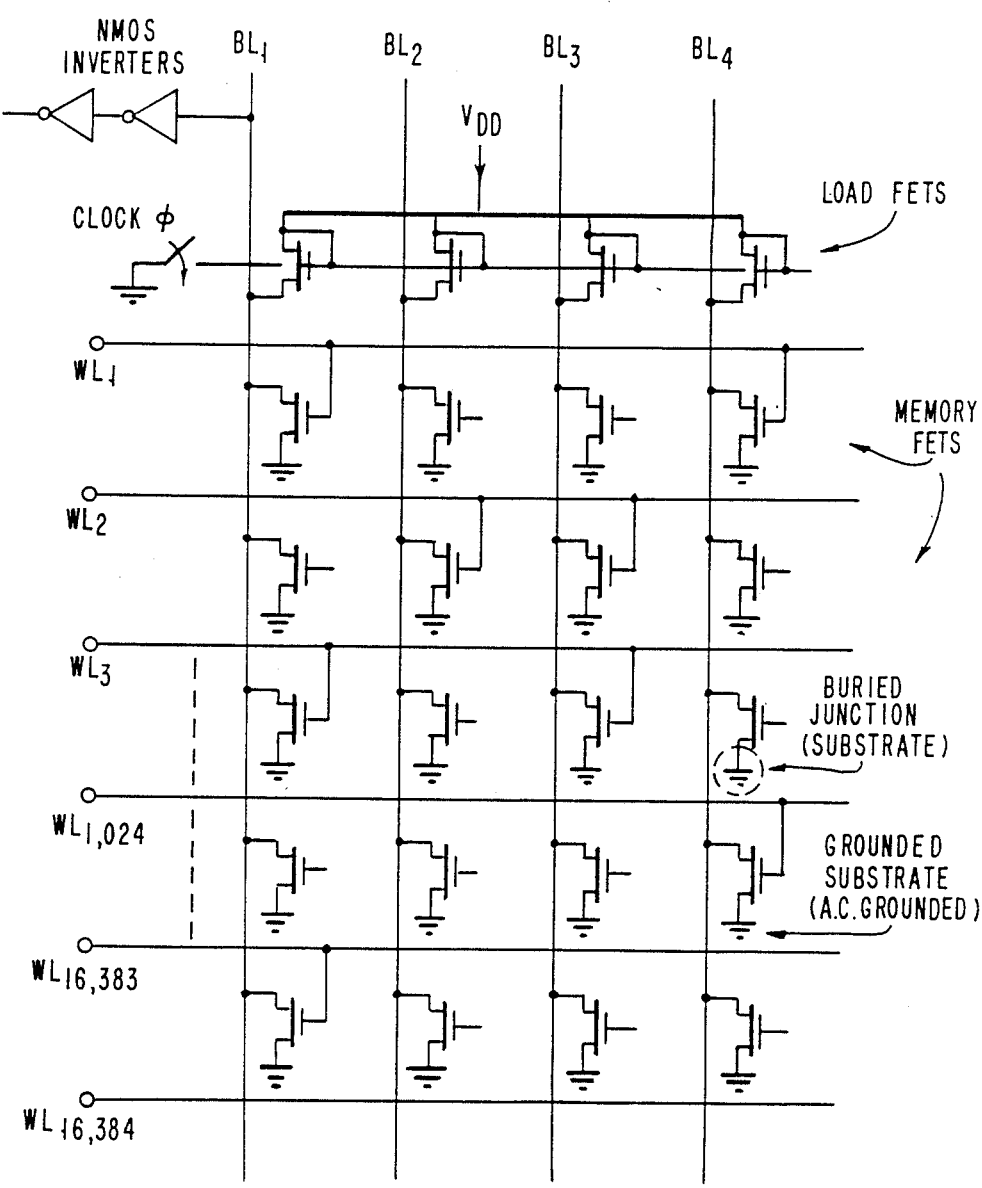
FIG. 13 is a schematic illustration of the trench transistor devices of FIGS. 1 and 12 employed as a ROM cell connected between word and bit lines in a memory array.

The first example of an application of the LDD trench transistor to a cell arraY of a cross point ROM cell is shown in FIG. 12. For example, a 14-bit input address code, results in $2^{14}=16,384$ word lines, with 4 bits per output address code. The memory array for this system consists of $16,384\times4$ (64K) intersections, as indicated schematically in FIG. 13. This address code conversion to be performed by ROM is permanently programmed during the fabrication process by using a custom-designed BEOL mask so as to construct or omit a trench at each array intersection. Such an array is indicated in FIG. 13, which shows how the memory FETs are connected between word and bit lines. This arrangement is different from the conventional ROM array which is programmed at each bit line. Also, using the n+ diffusion bit lines as interconnections leads to the advantage of reduced drain contact area. Furthermore, the source and drain are verticallY isolated, so that there is no need for an isolation region in the cell array. A 3.6 $\mu m^2$ cell is achievable using 0.7 $\mu m$ technology. This corresponds to the cell size of 16 Mb ROMs.

Figure 14:
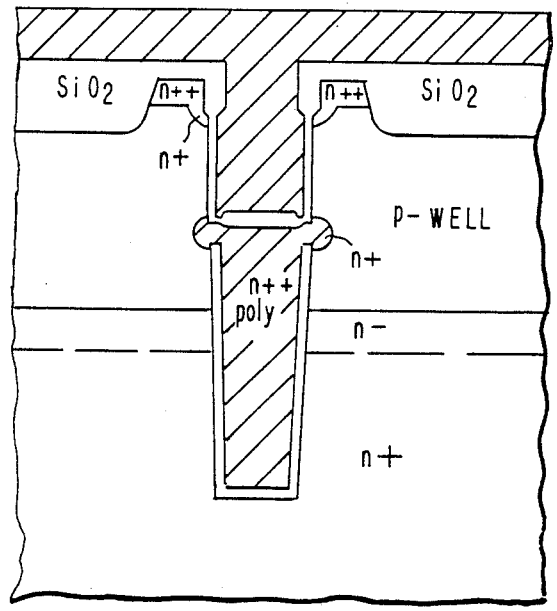
FIGS. 14 and 15 are schematic illustrations of the trench transistor device of the present invention employed as DRAM cells.
Figure 15:
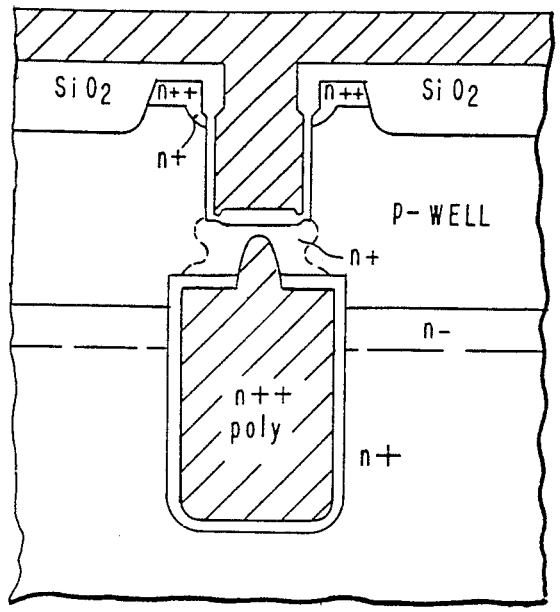

The LDD trench transistor of the present invention can also be used with DRAM cell arrays to improve the DRAM cell performance. As mentioned before, by adding the nitride sidewall spacer and oblique angle ion-implantation process steps, new LDD access trench transistor can be incorporated into the prior art cross-point DRAM cells which are shown in FIGS. 14 and 15, respectively, wherein the n-channel LDD trench transistor of the present invention is used instead of the conventional p-channel trench transistor.

What has been described is a novel fabrication process to fabricate a unique LDD trench transistor structure.

By using the nitride sidewall spacer technique, the thicker oxide over drain and source junctions are grown simultaneously. The coupling capacitances between the gate and drain junctions (or the wordline and bit line), and between the gate (WL) and storage node are reduced to a minimum. Hence the access performance of cross-point ROM and DRAM cells will be improved.

The spacer defined lightly-doped drain (LDD) structure optimizes the vertical transistor. The transistor provides self-aligned source and drain junctions, improved short channel effect, improved punch-through characteristics, lower mobility degradation and reduced overlap capacitance with minimized source and drain incremental resistance.

The topography of this new structure is flat after gate level; it can be easily enhanced by several additional levels of interconnecting metallurgy. Also the threshold voltage of vertical transistor can be adjusted by using oblique angle ion implantation technique, or electron cycletron resonant (ECR) surface doping technique.

We claim:
1. A self-aligned, slightly-doped drain/source field effect trench transistor device comprising:
   a substrate having a lower portion of heavily doped n+ conductivity semiconductor material, the upper portion of said substrate being light doped n− conductivity epitaxial semiconductor material, said upper lightly doped portion being less conductive than said heavily doped lower portion,
   a well region formed with p-type dopants disposed in said upper portion of said substrate.
   at least one polysilicon filled trench extending from the surface of said well region and into said well region, said trench being electrically isolated from said well region by a layer of gate oxide insulation on the bottom and sidewalls of said trench between the well region and said polysilicon in said trench, a source junction region located in said well region beneath the bottom surface of said trench, a diffusion region forming a first drain junction region disposed in said well region, said first drain junction region being heavily doped with n++ type dopants, said first drain junction region being located on the surface of said well regional surrounding said trench, a second lightly-doped drain junction region lightly doped with n+ type dopants in said well region proximate said first drain junction region and being self-aligned with the upper portion of said sidewalls of said trench, and a polysilicon word line element disposed over said polysilicon filled trench.

2. A transistor device according to claim 1 wherein said well region forming said sidewalls of said trench are doped with p+ type dopants to control the n-channel threshold voltage of said transistor device.

3. A transistor device according to claim 2 wherein said diffusion region forming said first drain junction region also forms a bitline element for said transistor device, and wherein said bitline element and said polysilicon wordline element form a cross-point.

* * * * *